United States Patent [19]

Callemyn

[11] Patent Number: 4,991,112
[45] Date of Patent: Feb. 5, 1991

[54] GRAPHICS SYSTEM WITH GRAPHICS CONTROLLER AND DRAM CONTROLLER

[75] Inventor: Jean-Michel Callemyn, Nogent Sur Marne, France

[73] Assignee: U.S. Philips Corporation, New York, N.Y.

[21] Appl. No.: 289,292

[22] Filed: Dec. 21, 1988

[30] Foreign Application Priority Data
Dec. 23, 1987 [FR] France ............................. 87 18041

[51] Int. Cl.⁵ .......................................... G06F 15/20
[52] U.S. Cl. .................................. 364/518; 340/799; 364/521
[58] Field of Search ........................... 364/518–523, 364/200 MS File, 900 MS File; 340/748, 750, 798–800; 365/222

[56] References Cited

U.S. PATENT DOCUMENTS

| | | | |
|---|---|---|---|
| 4,453,214 | 6/1984 | Adcock | 364/200 |
| 4,802,118 | 1/1989 | Honda et al. | 340/750 X |
| 4,816,815 | 3/1989 | Yoshiba | 340/750 |

Primary Examiner—Gary V. Harkcom
Assistant Examiner—H. R. Herndon
Attorney, Agent, or Firm—Michael E. Marion

[57] ABSTRACT

A graphics system comprising a screen processor which separately formulates the requests for access to a single word and the requests for access to a plurality of consecutive words, a bus arbitrator to arbitrate the requests for access to a single word and to select a request, and a DRAM Dynamic Random Access Memory, controller to arbitrate the requests for a plurality of words and the refresh requests. The DRAM controller preferably comprises an automatic system which directly generates line and column control signals. The automatic system is preferably constructed in the form of a PLA (Program Logic Array).

11 Claims, 4 Drawing Sheets

GRAPHICS SYSTEM WITH GRAPHICS CONTROLLER AND DRAM CONTROLLER

BACKGROUND OF THE INVENTION

The present invention relates to a graphics system.

Graphics systems are well known in the industry concerned with the display of images on cathode ray tube screens employing line by line scanning. The image elements, or pixels, are stored in a dynamic DRAM memory.

In such a graphics system, the DRAM memory is driven, in read and in write, by various processing modules which formulate requests for access. These requests may be simultaneous, while their execution cannot be so, and it is therefore necessary to provide arbitrating means. In order to do this, a known priority logic system is described in French Patent Application No. 2,593,304, which application corresponds to U.S. Pat. No. 819,727 filed on 17 January 1986 by the company Intel, the implementation of which is found in the INTEL graphics controller No. 82786 as described in the technical brochure AP270, especially on p.19. This known system provides various parametric registers, according to the choice of the user, to allocate priorities to the requests for access. This solution is relatively complex, and the user must proceed by successive trials in order to find the parameters giving the highest performance levels, and furthermore the technical construction of the described device is relatively expensive.

SUMMARY OF THE INVENTION

The object of the present invention is, inter alia, to provide a graphics system, the management of the access priorities of which is such that the user is certain that there is no dead time in the course of execution, and such that its technical construction is simple and compact, and therefore economical.

According to a first aspect, a graphics system according to the invention is particularly noteworthy in that each said request for reading of the information items of a window comprises, on the one hand, at least one request for access to a single word (REQ3) to read a description of the said window, and, on the other hand, a request for reading, in bursts (RAF), of a plurality of words to read pixels of the said window, and in that the said means for arbitrating (BUSAR) comprise first arbitrating means, hereinafter referred to as internal bus interface, to select a first request selected (REQS) between the said requests for access to a single address (REQ1, REQ2, REQ3) and second arbitrating means to select a second request selected to be executed between the first request selected (REQS), the refresh request (REQFR) and the request for reading bursts (RAF), and in that the said second arbitrating means and the said generating means are merged in a same module (AUTO) comprising an automatic system with a finite number of states Thus, according to the invention, the accesses of the graphics system to the DRAM are managed by two complementary arbitrating systems. The first arbitrating means arbitrate exclusively between the accesses to a single memory word, also referred to as slow accesses, while the second arbitrating means arbitrate essentially between the accesses in bursts, also referred to as rapid accesses. The preselected access to a single word permits preference to be given to the display accesses per se, in such a manner that the reading of the pixels in the DRAM never delays the display of the pixels on the screen. The joining in a same module of the second arbitrating means and the means for generating the sequences of control signals results in a situation in which there is no dead time between the taking of an arbitration decision and its execution; this likewise results in a compact technical construction.

The periodic refreshing of the DRAM may always be a priority matter and take place at a fixed instant during, or at the beginning of, the line return of the scanning of the screen.

In a preferred embodiment, the s id processor is provided with means for detecting the instant of which all the pixels of the last window of each screen line have been read in the DRAM, and, in this case, for generating immediately, that is to say without awaiting a fixed date from the termination of display, a refresh request By preserving the highest priority for the request for refreshment of the DRAM, the execution of this request will commence as soon as possible, without awaiting the commencement of the line return, in such a manner that the DRAM does not remain inactive, or poorly employed, in the time interval which separates the completion of the reading of the last pixels of a line and the termination of their display. Thus, the refresh takes place, accord the invention, no longer at a fixed instant but at variable one, as soon as possible, while still respecting the mean periodicity of a refresh at each line return.

In the already mentioned known system, the management of the priorities can be made subject to parameters according to the choice of the user.

In a preferred embodiment, the first means for arbitrating are arranged to permit differing priorities according to whether the system is in a display period, in a refresh period, in a line return period, or in a frame return period.

Thus, it is possible to optimize the accesses to the DRAM with the greatest precision, without the user having to search for the best choice.

The throughput, in rapid read, of the pixels of the DRAM is greater than the display throughput of the pixels on the screen, and, to this end, the screen processor comprises a first-in-first-out FIFO memory which emits a signal when it is full. According to the invention, on reception of this signal the automatic arbitrating and generating system is arranged to interrupt the reading in bursts in progress and, where appropriate, to comply with a possible pending preselected access request.

Thus, even during the graphics period during which the accesses in bursts have the highest priority, the DRAM does not remain unused, even where there is a waiting time.

A DRAM can be organized, at the choice of the user, according to an organizational mode to be chosen from among either the four-bit mode or the page mode and, in the case of the page mode, with or with out interlacing of the memory banks, the said choice being initially made on the initiative of the control microcomputer and then stored in registers of the DRAM controller. According to a preferred embodiment, the said automatic system is connected to the said registers and is arranged to generate sequences of control signals of the DRAM which are in accordance with the said choice of the organizational mode.

Thus, a graphics system according to the invention is adaptable to the various choices of the user, while guaranteeing to him an optimization of the management of the accesses to the DRAM.

According to a preferred mode, the automatic system is constructed in the form of PLA; this minimizes the utilization of silicon surface and, as a result of this, guarantees a technical construction which is simple and economical.

BRIEF DESCRIPTION OF THE DRAWINGS

The present invention will be better understood with the aid of the non-limiting description of an embodiment illustrated by drawings and tables.

DESCRIPTION OF A PREFERRED EMBODIMENT

Figure 1:
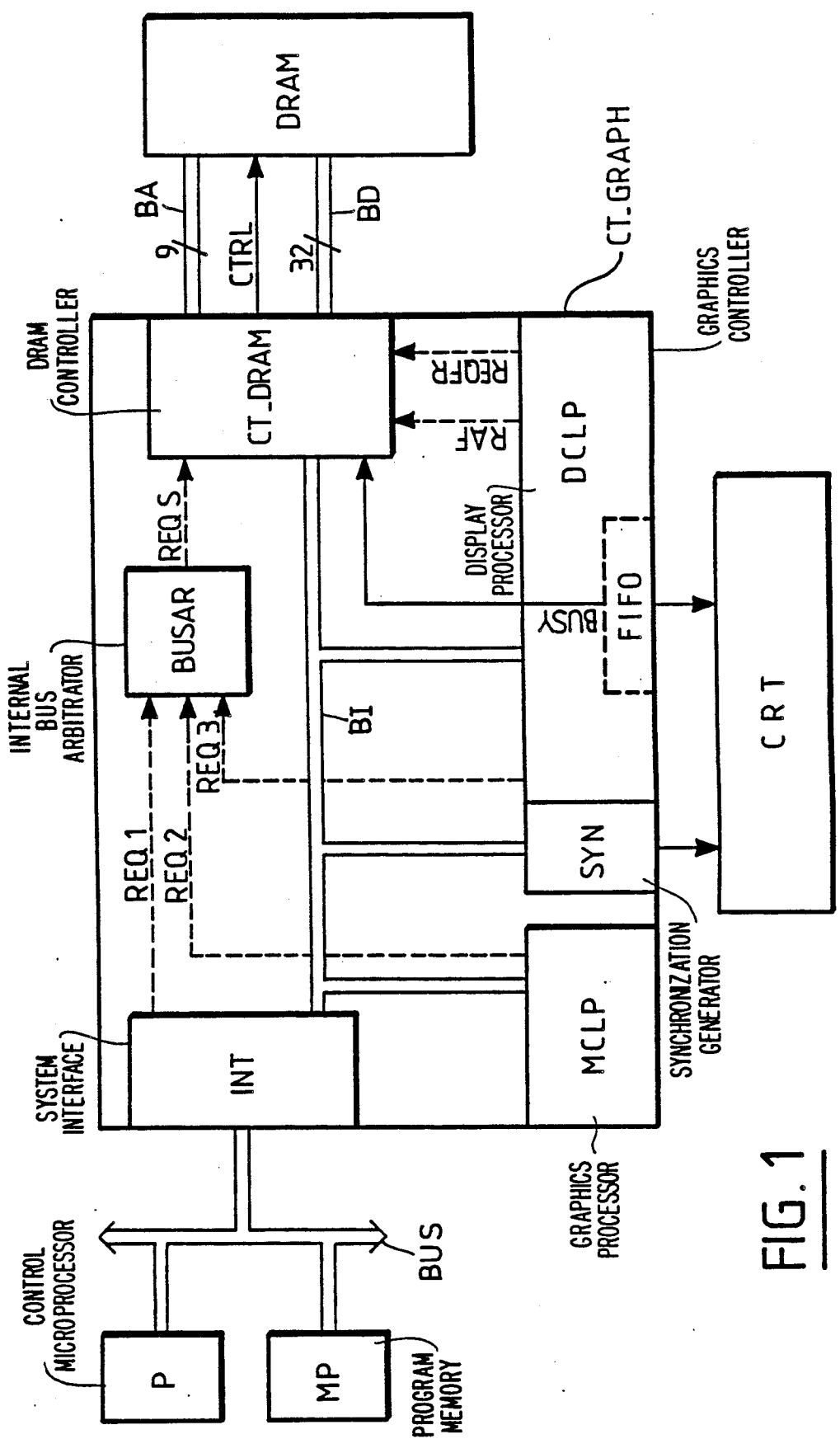
FIG. 1 represents the general architecture of a graphics system according to the invention.

In the diagram of FIG. 1, a graphics system comprises a microprocessor (P), for example a 68070, with its program memory (MP), which, via a bus, controls a graphics controller (CT.GRAPH) connected to a DRAM, for example an MN 41257 from Matsushita, and to a graphics display screen (CRT).

The DRAM, for example of 256 Kbits with 32 parallel packages, is connected by means of a 32-bit databus BD, of a 9-bit address bus BA and of a set of control connections (CTRL) for especially sequences of signals for column control (CAS) and line control (RAS). Certain sequences of these signals permit read accesses with high data rate to the DRAM; the dimension of the buses indicated hereinabove is clearly not limiting.

The graphics controller (CT.GRAPH) comprises a display processor (DCLP) associated with a synchronization generator (SYN) to control the screen (CRT). On account of the fact that the data rate of the DRAM is greater than the display data rate, the pixels read in the DRAM are temporarily stored in a FIFO contained in the DCLP. When the FIFO is full, it emits a filling signal (BUSY) to request momentarily the cessation of the reading of the pixels.

The graphics controller comprises a graphics processor (MCLP), and a system interface (INT) to communicate with the control microprocessor.

Requests for access to the DRAM are formulated by the three processors of the system: the control microprocessor (P), by the graphics processor (MCLP) and by the display processor (DCLP) connected together by the internal bus BI.

In order to manage these requests for access, which may be simultaneous, the graphics controller according to the invention comprises, on the one hand, an internal bus arbitrator (BUSAR) and, on the other hand, a DRAM controller (CT.DRAM).

A distinction is drawn between two types of request for access formulated by the DCLP: on the one hand, the requests for access to a single address, and on the other hand, the requests for access in bursts (RAF) to a plurality of addresses; the requests in bursts are exclusively requests for reading of pixels to supply the FIFO of the DCLP at a high data rate.

FIG. 1 also shows symbolically the connections provided to transmit the requests for access to a single address of the DRAM originating either from the control microprocessor (REQ1) or from the graphics processor (REQ2), or from the display processor (REQ3). These requests form the subject of a preselection processing in the internal bus arbitrator (BUSAR). The result of this preselection is the selection of a single selected request (REQS) which is transmitted to the DRAM controller (CT.DRAM).

Furthermore, the DRAM controller receives refresh requests (REQFR) and requests for access in bursts (RAF) originating from the DCLP. It carries out the arbitration between these three requests.

The operation of a CRT screen is broken down, cyclically, into a frame return period and into a plurality of scanning periods. Each scanning period comprises a stage of display of the pixels and a line return stage.

The system permits the allocation of different priorities to the requests for access as a function of these periods and/or stages.

During the display stage, the greatest priority is given to the DRAM accesses which supply the FIFO of the DCLP. Each one of these accesses comprises, first of all, a preparatory phase and then a phase of actual reading of the pixels. In practice, all the accesses to a single address (REQ3) are preparatory accesses, and all the accesses in bursts (RAF) are actual reads of pixels. After the preparatory read the priority is given to the read in bursts (RAF), otherwise the priority is given to the preparatory read (REQ3). The read in bursts may be interrupted when the FIFO is full (BUSY). In this case, the bus arbitrator gives the priority to a possible pending preparatory read (REQ3). In its absence (REQ3), a read requested by the control microprocessor (REQ1) may be satisfied, but as soon as the FIFO starts to be emptied, on account of the display, the interrupted read in bursts is continued as a priority matter.

During the line return stage, differing priorities are still allocated: firstly refreshment of the DRAM, secondly filling of the FIFO to prepare for the display of the following line, thirdly compliance with the accesses requested by the MCLP (REQ2), and then with the accesses requested by the microprocessor (REQ1).

According to a preferred mode, the refreshing of the DRAM is carried out as early as possible, that is to say as soon as the reading of the last pixel of the line is carried out. The DCLP detects this moment and thus the refreshment can commence slightly before the line return per se. As a result of this, the refresh commences at a movable instant and not at a fixed instant which would be, for example, the commencement of the line return. To this end, the DCLP formulates the refresh request (REQFR) as soon as the last read in bursts for a line is terminated.

The number of lines to be refreshed on each occasion is dependent upon the memory capacity of the DRAM, in order that the DRAM should be entirely refreshed at the appropriate time, that is to say, for example, every 4 msec. By refreshing 6 DRAM lines on each occasion, it is thus possible to refresh (4000 $\mu$sec:64 $\mu$sec) x6 lines, that is to say 375 lines, every 4 msec; this is amply sufficient. For the DRAM indicated hereinabove, each refresh is carried out, for example, in 2 $\mu$sec. After the refresh period, it is necessary, at an initial stage, to initialize the access to the pixels of the following line until filling of the FIFO, and then to comply with the possible pending requests for access at the interface of the internal bus. At this moment, by decreasing order of priority, only the accesses MCLP (REQ2) and the microprocessor accesses (REQ1) are taken into account.

During the frame return period, the refreshes are carried out as a priority matter, and periodically, at a fixed instant. The remainder of the time is allocated first of all to the MCLP request (REQ2), and then to the microprocessor request (REQ1).

The requests for access to a single address, that is to say REQ1, REQ2 and REQ3, are arbitrated by a bus arbitrator (BUSAR) which consists of a combinatorial logic gate system.

Figure 2:
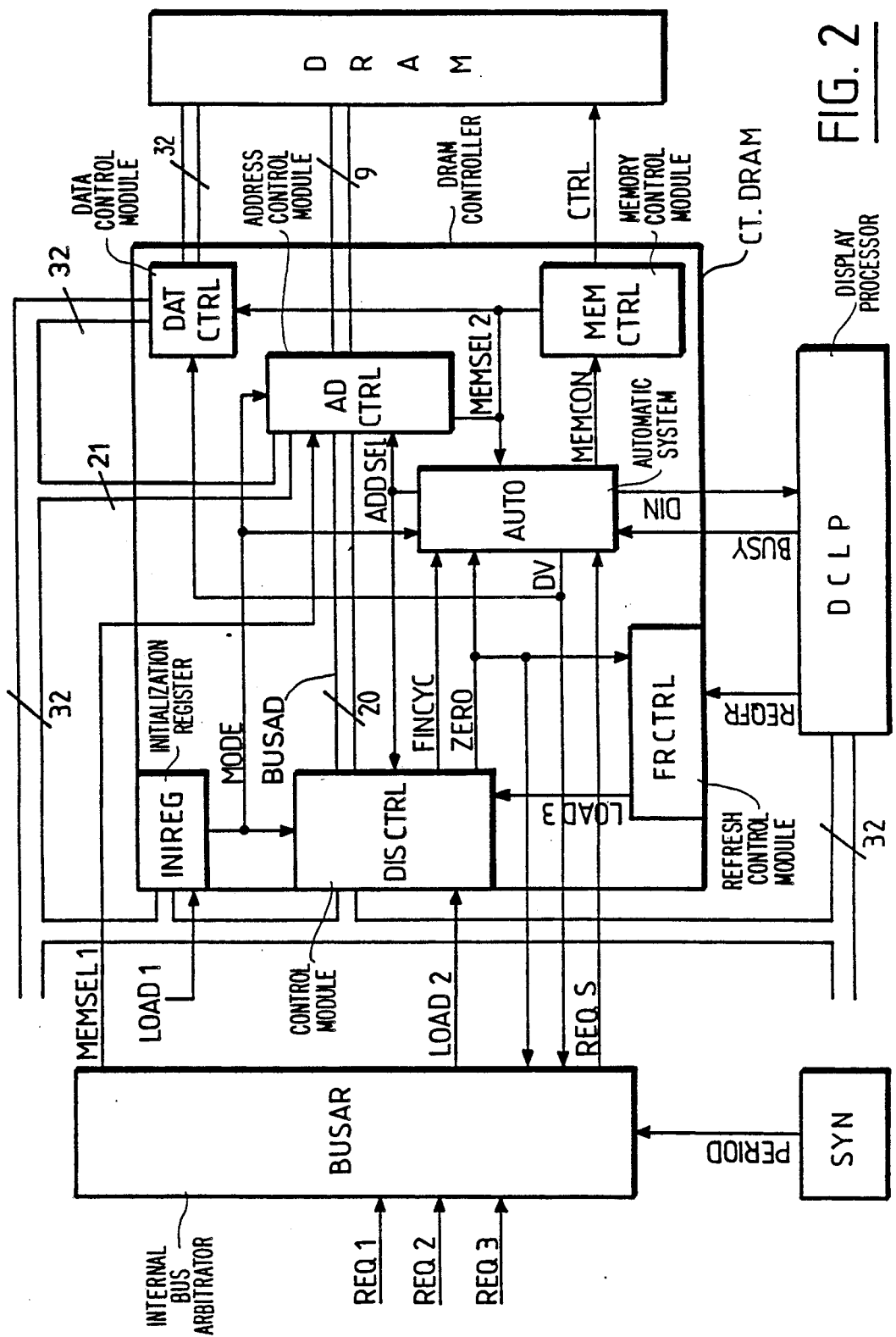
FIG. 2 represents a part of FIG. 1, including in particular the DRAM controller, and its insertion in the graphics system.

FIG. 2 represents essentially the architecture of the CT.DRAM controller. It is designed in such a manner that it can be implanted completely on a single chip with all its functional properties. These make it generally usable in a graphics system with any type of DRAM and with differing DRAM organizational modes: 4-bit mode (nibble), page mode without or with interlacing (interleaving).

The DRAM controller (CT.DRAM) comprises:

(A) An initialization register (INIREG).

This register stores the parameters specific to the selected DRAM and to its organizational mode, for example: refreshment of 4 or of 6 pages at a time, organization in 4-bit mode or in page mode and, in this case, with or without interlacing, dimension of each memory bank. The initialization register may, for example, comprise 6 bits:

1 bit to indicate the number, 4 or 6, of pages to be refreshed 3 bits for memory bank of 64 K, or 256 K, or 1 M.

1 bit for the 4-bit mode, or not.

1 bit for the interlacing mode, or not.

The specific parameters are initially positioned by the control microcomputer via a load command LOAD1. During operation, these information items are available on the MODE connection(s) as described hereinafter.

(B) A refresh control module (FRCTRL). This module receives from the DCLP the order for the commencement of a refresh cycle (REQFR) as aforesaid. In this case, this module transmits, via the LOAD3 connection, the next address to be refreshed, which has previously been stored and indexed cyclically. This module also transmits a refresh request (REFRESH not shown) to other modules including, in particular, an automatic system described hereinafter. The number of pages to be refreshed is loaded into a counter, which is decremented progressively until it indicates that the refresh is terminated; in this case, the refresh controller stores the address thus indexed as aforesaid with a view to the next cycle.

(C) A module for controlling the read in bursts (DIS CTRL). This module receives, at the input, the data available on the 32-bit internal bus BI; these data are the address of the next word to be read in bursts, on 20 bits, and the number of words to be read, on 8 bits. The command LOAD2 which it receives permits these data to be taken into account It is the loading of these data which constitutes the request for access in bursts (RAF) aforesaid. At the output, this module positions a signal ZERO which indicates whether there are or are not remaining words to be read; to this end, this module comprises a decrementing counter of the number of words to be read; this counter is initialized with the command LOAD2 and is decremented on the occasion of each read of a word in the DRAM. It may happen that a read in bursts comprises words situated on a plurality of pages or that, in the case of the 4-bit mode, the burst comprises words situated in a plurality of groups of 4 words. This situation is detected by the module and a signal (FINCYC) is set at the output of the module destined for the automatic system described hereinbelow, in order that the latter should take account thereof to reset the signals RAS and CAS. At the output, the module delivers, by means of an address incrementer, the address in the course of being read in bursts on a 20-bit address bus BUSAD.

Having regard to the priorities imparted to the DRAM accesses as indicated hereinabove, it is possible to use the same address incrementer and the same decrementing counter of the number of words both for the reads in bursts and for the refreshes.

For the same reason, the same signal ZERO indicates, if it switches to "1" (that is to say counter=0), either the end of a read in bursts or the end of a refresh; conversely, if it switches to "0" (that is to say counter≠0), it indicates that there is to be complied with, either a read in bursts or a refresh. Furthermore, the same bus is used to transmit the address either of the read in bursts or of the refresh.

(D) An address control module (AD.CTRL). This module receives, on the one hand, the address emitted by the module (DIS CTRL) and, on the other hand, the address present on the 21-bit internal bus BI corresponding to a possible preselected request for access to a single word (REQS); the indication of the proper choice to be made between these two addresses originates from the automatic system described hereinbelow by the command ADDSEL; the address selected in consequence of this choice is set at the output on the address bus of the DRAM (in multiplexed use 9+9 bits).

This addressing control module also receives, at the input, the aforementioned MODE signals and, in consequence, emits at the output the appropriate memory selection signals MEMSEL2.

(E) A memory control module (MEM CTRL). This module effects a simple selection on the basis of the control signals which it receives to select the memory zones accessed (bank, word, half-word, octet); in order not to overload the description, it will not be described in greater detail.

(F) A data control module (DAT CTRL) to select the direction of the data transfer (read, write) and to multiplex the data on the bus.

(G) On the one hand, an automatic arbitration system to arbitrate between the requests for access, and, on the other hand, an automatic generation system to generate sequences of control signals of the DRAM via the module MEM CTRL.

The automatic system (AUTO) receives principally the abovementioned signals which are active with the value 1:

REFRESH: signal originating from the abovementioned module FRCTRL indicating that there is or is not a refresh cycle to be executed (not shown).

ZERO: abovementioned signal.

FINCYC: abovementioned signal.

CASSEL: signal for selection of even/odd address valid only in the interlaced mode (not shown).

BUSY: signal indicating, or not, that the FIFO of the DCLP is full.

WRITREQ/READREQ: signals indicating, or not, that there is a preselected access request for a single word (REQS) originating from the bus arbitrator (write or read, depending upon the particular case).

MODE: signals signifying the organizational mode of the DRAM which have already been mentioned hereinabove, for example INTER=1 for the interlaced mode and NIBBLE=1 for the 4-bit mode.

The first task of the automatic system is to arbitrate the requests in accordance with the aforementioned priorities, and thus to elect a request to be executed. The requests for reading in bursts (RAF) and the refresh requests (REFRESH) may have the same priority, which is also the greatest, because these requests can never be in competition as aforesaid.

The second task of the automatic system is to generate the signals corresponding to this elected request.

The signals generated at the output are principally:

| | |
|---|---|
| — MEMCON: | memory control, in particular:<br>—RAS: positioning of the row addressing<br>—CAS: positioning of the column addressing; there are two signals CAS1 and CAS2 in the case of interlacing<br>—WR: write signal (in the case of access to a single word) |

ADSEL: signal representing choice of the address corresponding to the request to be executed, in order to cause the latching (Latch) of the address DV: signal for validation of the data read in the case of access to a single word DIN: signal for validation of each data item read in the case of access in bursts.

An automatic system with various states in a finite number, passes at each clock stroke from one state to another. The sequencing of the states is conditioned by the development of the input signals and of the output signals. Certain output signals of the automatic system serve exclusively as inputs of the automatic system to condition the sequencing of the states.

In the present case, the execution of each request for access which is elected corresponds to a succession of combinations of output signals, certain ones of which are identical from one request to the other. The various possible combinations of the output signals may then be included, and a condition number is allocated to each one of them.

The tables provided in the enclosure indicate:
  Table A: Table of the 21 possible conditions of the automatic system and of the corresponding output signals.
  Table B1..B..: List of the conditions of passage from one condition to the other
  Table C: Diagram of the possible sequencings of the conditions of the automatic system The output signals looped back at the input for 5 bits for transmitting the 21 possible conditions.

In the table A, for each condition 0 to 20, the output signals set at "1" are indicated; the signals set at "0" have been left blank in order not to overload the table, except for the condition 0.

The significance of the output signals is the following, depending upon whether they are set or not:

Signals active at the value "0":
RAS : Validation of the line address
CAS 1 : Validation of the column address
CAS 2 : Validation of the column address (case of interlacing)

Signals active at the value "1":
DV : Validation of data item read, access to a single word
WR : Validation of writing in memory
RESW : Acknowledgement of write reception
MUX : Selection of line/column address
ADD : Latching of address for read in bursts, or for refresh; this signal permits the incrementation and the decrementation of the counters of the module DISCTRL as aforesaid.
ADDM : Latching of address for reading for a single word
DIN : Validation of data item read, access in bursts.

In the tables B1..B.., the conditions of passage from one condition to another are represented in Boolean language to determine, as a function of the input variables, to what condition the automatic system must proceed.

The input variables are:
WRITREQ: Request for writing of a single word (see REQS mentioned above)
READREQ: Request for reading of a single word (see REQS mentioned above)
ZERO : end of a read in bursts or of refresh
BUSY : FIFO full
REFRESH: Refresh cycle to be executed
FP : end of a memory page (see FINCYC mentioned above)
INTER : interlaced mode
NIBBLE : 4-bit mode
ZERONIB end of a 4-bit cycle (see FINCYC mentioned above)
CASSEL : selection of even/odd address (useful in interlaced mode)

In the table, there is a Boolean formula for each condition, each formula being applicable when the clock signal PHI(2) is produced, leading to the permanent condition:
? PHI(2) ? →

The conditionings speak for themselves but, in order to avoid any confusion, the first condition of the state '0' will be detailed:

? −REFR. −WRITREQ. −READREQ. (ZERO+BUSY)?
→STATE0 this condition signifies:
  If there is neither

| | |
|---|---|
| (a) refresh request, | (−REFR) |
| (b) nor request for writing of a single word | (−WRITREQ) |
| (c) nor request for reading of a single word | (−READREQ) |
| (d) nor a request for reading in bursts | (ZERO+ . . . ) |
| (e) or alternatively if the FIFO of the DCLP is full<br>(in the case of a request for reading in bursts, that is to say −ZERO)<br>then go to the state '0'. | ( . . . +BUSY) |

This amounts to saying to the automatic system that if there is nothing to be done (a, b, c, d) or if it is impossible to do what is requested (e), the automatic system must main in the state '0', that is to say awaiting a request which can be executed. The other conditionings are no more than the Boolean formulation of what has been stated hereinabove.

The automatic system is thus perfectly defined by the indications provided by the tables A and B1..B.

Figure 4:
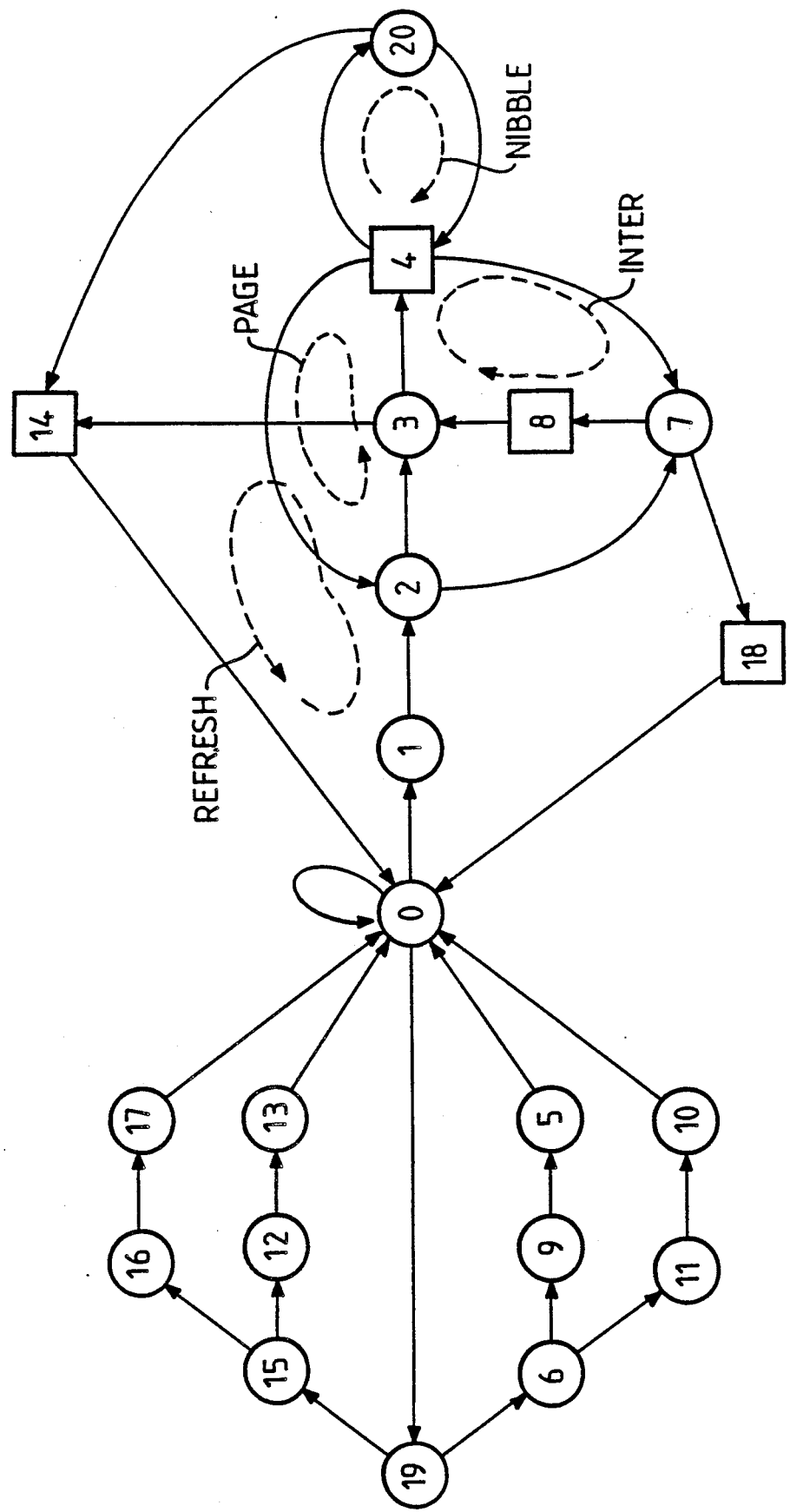
FIG. 4 represents the diagram of the states of the automatic system.

The tables may be taken in combination in order to construct FIG. 4, which is the diagram of the successive states of the automatic system.

On this diagram, on the left-hand part, 1' State 0 then State 19 etc . . . the accesses to a single word (REQS) are processed:

the states 15-12-13 process the reading of an odd address word in interlacing the states 15.16.17 process all the other readings in reading, the data item read is validated (DV=1, cf. table A) either in state 13 or in state 17.

the states 6.9.5. process the writing of an odd address word in interlacing the states 6.11.10 process all the other writings. in writing, the signal WR remains set during two clock strokes (either 6+9 or 6+11) in accordance with table A.

An access to a single word has a duration of only 5 clock cycles and is never interrupted.

On the right-hand part, the refreshes and the accesses in bursts are processed, indicating the mode of operation:

The states of square form are the states in which the signal DIN is set, and a data item is at this moment available on the bus.

The other states, of round form, are states of preparation of the signals which are necessary for the current operation.

A refresh cycle passes through the states 1, 2, 3, 14, 0 as indicated by the strokes It is in the state 1 that the signal ADD is set, destined for the module DISCTRL as mentioned above.

For the readings in bursts, it is noted that, the state 4, in which the signal DIN is set, is an obligatory passage, from which there is departure to different states, according to the organization of the DRAM, i.e. respectively:

state 20 in 4-bit mode (condition 'IF' NIBBLE of the state 4 of table B1)

state 7 in interlacing (condition 'IF' INTER of table B1)

state 2 in page mode (condition 'IF' -INTER.-NIB-BLE)

In the 4-bit mode, a normal read sequence passes successively through the states:

0, 1, 2, 3, 4, 20, 4, 20, 4, 20, 14, 0

The state 4 and the state 14 are underlined in order to demonstrate effectively that there is passage normally 4 times by the signal DIN set before detecting the condition ZERONIB.

This simple read cycle may be disturbed as mentioned above (see FINCYC, BUSY, . . . ), the event then being taken into account in the state 20, or in the state 3, and in these two cases the procedure goes to the state 14, before reverting to the state 0.

In the page mode, a simple read sequence passes successively through the states:

0, 1, 2, 3, 4, 2, 3, 4, . . . ,2, 3, 14, 0.

The sub-sequence 2, 3, 4 is repeated as many times as there are words to be read, provided that no disturbance takes place. In the opposite case, this is taken into account in state 3.

In the mode with interlacing, the read loop passes successively through the states:

in order to reenter the loop, the sequence commences by the states 0, 1, 2 and then, depending on whether the first address to be read is even or odd, reentry into the loop takes place either by the state 3 or by the state 7, respectively. The read loop takes into account the disturbing events either in state 3 or in state 7.

In a general way, in the case of disturbance of a cycle of reading in bursts, a read, either in state 14 or in state 18 is still performed before they return to the waiting stage. This implies that the disturbance conditions (such as 'end of page', 'end of cycle', 'FIFO full') must be detected in time, so that the latter read may take place.

The automatic system thus described is advantageously constructed in the form of a programmable array, hereinafter referred to as PLA. The construction of a PLA on the basis of the tables A and B is directly practicable with automatic software available for doing this.

The choice of the inputs, of the outputs and of the conditionings (table B) has an effect on the chip surface occupied by the PLA; the choices made here have resulted in an optimized PLA. This optimization does not prevent a situation in which certain states are identical from the point of view of the output signals set (in the table A: 7=12, 3=16, 2=15=20), but these identical states are not inserted in identical sequences. Other possibilities can be contemplated, without departing from the scope of the present invention.

In FIG. 2, the BUS arbitrator (BUSAR) is represented; it receives the abovementioned signals (REQ1, REQ2, REQ3 and it emits, in particular, the memory selection signals (MEMSEL1) resulting from the arbitration carried out for the address control module (AD CTRL). The signal REQS signifying the preselected request as mentioned above is, in the embodiment described here, composed of two signals as mentioned above: READ REQ and WRIT REQ. The arbitration priorities depend, as mentioned above, upon the period in progress (frame, display, line return, . . . ); to this end, the bus arbitrator (BUSAR) receives from the synchronization module (SYN) signals (PERIOD) signifying the period in progress.

Table C represents the differing priorities of the bus arbitrator (BUSAR). These priorities relate only to the accesses to a single word, since the other accesses are arbitrated by the automatic system. The conditions of arbitration of each column of the table are as follows:

During the frame return (RTRAM) : Column 1 Priority MCLP and then P.

Outside the frame return (RTRAM): During the line return (RLIG)

Column 2:

If 'ZERO', that is to say at the end of the refresh, priority exclusive to the DCLP to prepare the access in bursts to the pixels of the following line.

10 Column 3:

If 'ZERO', that is to say that there is a read in bursts in progress (BUSY), or awaited (BUSY), priority to the MCLP and then to P.

Outside the line return (RLIG), that is to say during the display period

Column 4:

If 'ZERO', that is to say there is no access in bursts in progress, then, exclusive priority to the DCLP to prepare the next access in bursts. Column 5:

If 'ZERO', that is to say that there is an access in bursts in progress (and thus that a 'BUSY' may arise)

then priority to the DCLP, then to P.

Table C thus demonstrates another advantage resulting from the fact that the same word counter is used for the accesses in bursts and for the refreshes; in fact, the same signal ZERO, with different functional significances, is used for identical priorities in the columns 2 and 4; as a result of this, the system of logic gates which comprise the bus arbitrator is extremely simple, compact and easy to construct.

Figure 3:
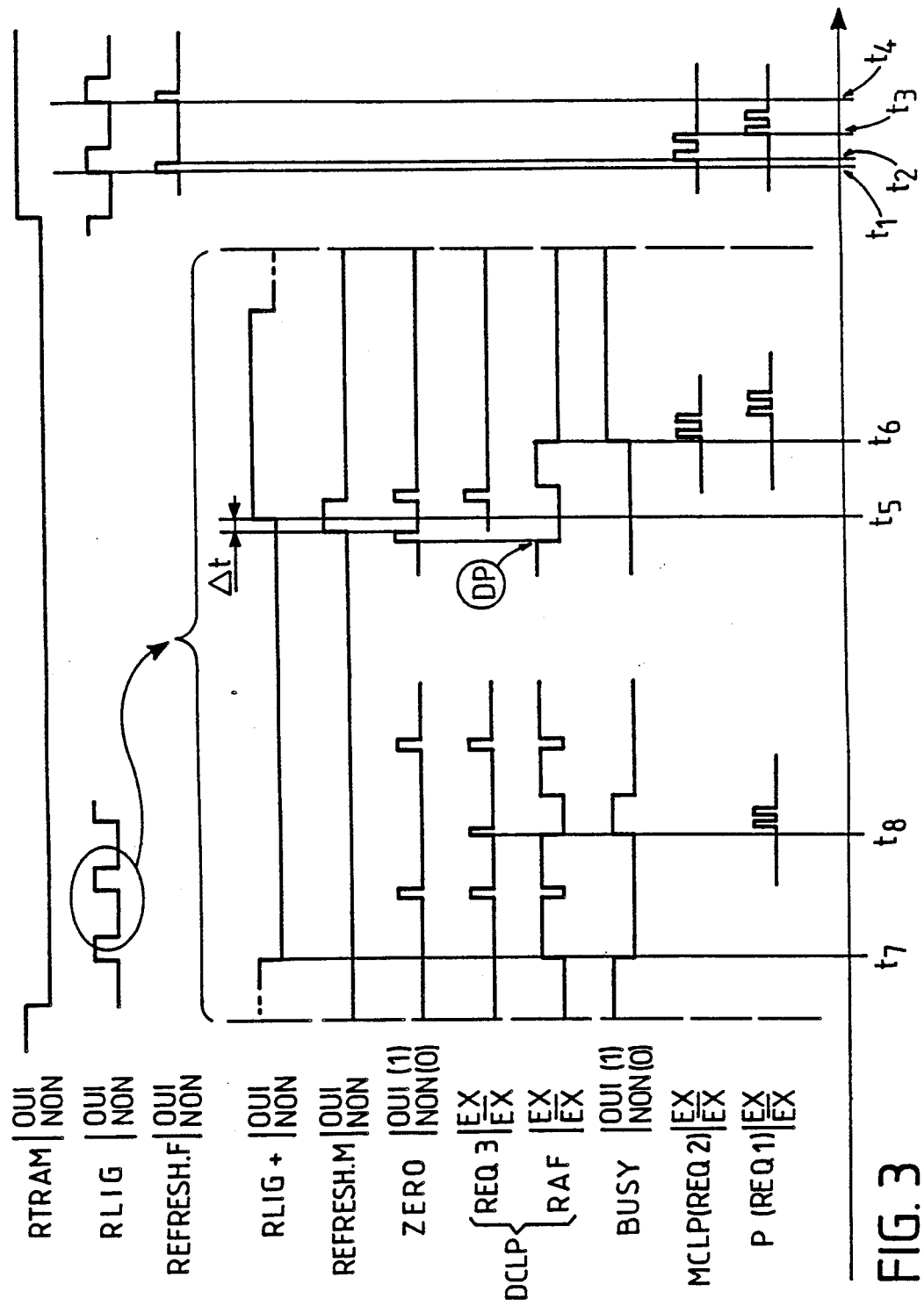
FIG. 3 represents a diagram of the priorities as a function of the time periods.

FIG. 3 represents the diagram of certain signals and actions.

The signals signifying the frame return (RTRAM) and the line return (RLIG) are represented.

During the frame return (at the top right of FIG. 3), the refreshes are undertaken at a fixed instant (REFRESH.F) at each rise of the signal RLIG; for example, at the instant t1, a refresh is commenced; it is terminated at the instant t2; at this moment, and until the instant t4, the bus arbitrator gives priority to the MCLP accesses (REQ2) and then, for example at the date t3, to the microprocessor accesses (REQ1).

Outside the frame return, the figure has been enlarged to demonstrate better (RLIG+) the stages of display and of line return for a single line which, in combination, form an elementary operation cycle.

Before the line return which takes place at the date t5, the last pixel of the current line has been read as indicated by the arrow DP which points to the execution (EX) of a read in bursts (RAF); at this time, the signal ZERO passes to 1 and, as mentioned above, the DCLP generates a refresh request at a movable date (REFRESH.M), the execution of which commences before (t) the line return signal which switches over at the fixed date t5.

In the course of the duration of the refresh, the signal ZERO emitted by the refresh word counter is at '0', as the counter itself is not at '0'; at the end of the refresh, the signal ZERO switches over and now the applicable case is that of column 2 of table C, that is to say that it is necessary to prepare the display of the following line by means of a preparatory access DCLP (REQ3) followed by one (or more) accesses in bursts (RAF) which, at this moment, can be interrupted only by the filling of the FIFO; this is reflected in the rise of the signal BUSY (date t6); now, as indicated in column 3 of table C, MCLP accesses (REQ2) and then microprocessor accesses (REQ1) may be executed.

At the fixed date t7 the display of a line commences, which display has, in principle, been prepared as mentioned above; the display on the CRT screen gives rise to the descent of the signal BUSY and the execution of the access in bursts resumes until such time as this access is terminated; this is reflected in the rise of the signal ZERO signifying the read word counter; this rise of the signal ZERO causes the execution of an access REQ3 preparing for the following burst and so on until the end of the line.

It may happen, at date t8, that a read in bursts is interrupted by the signal BUSY; at this moment, an access REQ3 and then microprocessor accesses (REQ1) may be executed (see column 5 of the table C) until such time as the signal BUSY falls again and then permits the resumption of the interrupted read in bursts.

TABLE A

| | No. | | | | | | | | | | | | | | | | | | | | |
|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 |
| RAS | 1 | 1 | | | | | | | | | | | | | | | | | | 1 | |
| CAS1 | 1 | 1 | 1 | | | 1 | 1 | 1 | 1 | 1 | | | 1 | 1 | | 1 | | | | 1 | 1 | 1 |
| CAS2 | 1 | 1 | 1 | 1 | 1 | | 1 | | | | 1 | 1 | | | 1 | 1 | 1 | 1 | | 1 | 1 |
| DV | 0 | | | | | | | | | | | | 1 | | | | 1 | | | | |
| WR | 0 | | | | | 1 | | | 1 | 1 | | | | | | | | | | | |
| RESW | 0 | | | | 1 | | | | 1 | | | | | | | | | | | | |
| MUX | 0 | 1 | | | | | | | | | | | | | | | | | | 1 | |
| ADD | 0 | 1 | | | 1 | | | 1 | | | | | | | | | | | | | |
| ADDM | 0 | | | | | | | | | | | | | | | | | | | 1 | |
| DIN | 0 | | | 1 | | | | 1 | | | | | | | 1 | | | 1 | | | |

TABLE B

| | |
|---|---|
| STATE0: | ? PHI(2)? → |
| | (? −REFRESH.−WRITREQ.−READREQ.(ZERO+BUSY)?→STATE0 |
| | ? −ZERO.−BUSY+REFRESH?→STATE1 |
| | ? −REFRESH.(WRITREQ.READREQ).(ZERO+BUSY)?→STATE19) |
| STATE1: | ? PHI(2)?→STATE2 |
| STATE2: | ? PHI(2)→ |
| | (? INTER.CASSEL?→STATE7 |
| | ? −(INTER.CASSEL)?→STATE3) |
| STATE3: | ? PHI(2)?→ |
| | (? −ZERO.−BUSY.−REFRESH.−(NIBBLE.ZERONIB).(NIBBLE+ −FP)→STATE4 |
| | ? ZERO+BUSY+REFRESH+NIBBLE.ZERONIB+(−NIBBLE).FP?→STATE14) |
| STATE4: | ? PHI(2)→ |
| | (?−INTER.−NIBBLE?→STATE2 |
| | ?NIBBLE?→STATE0 |
| | ?INTER?→STATE7) |
| STATE5: | ?PHI(2)?→STATE0 |
| STATE6: | ?PHI(2)? |
| | (?INTER.CASSEL→STATE9 |
| | ?−(INTER.CASSEL)?→STATE11) |
| STATE7: | ?PHI(2)? |
| | (?−ZERO.−BUSY.−REFRESH.−FP?→STATE8 |
| | ?ZERO+BUSY+REFRESH+FP?→STATE18) |
| STATE8: | ?PHI(2)?→STATE3 |
| STATE9: | ?PHI(2)?→STATE5 |
| STATE10: | ?PHI(2)?→STATE0 |
| STATE11: | ?PHI(2)?→STATE10 |

TABLE B-continued

| | |
|---|---|
| STATE12: | ?PHI(2)?→STATE13 |
| STATE13: | ?PHI(2)?→STATE0 |
| STATE14: | ?PHI(2)?→STATE0 |
| STATE15: | ?PHI(2)? |
| | (?INTER.CASSEL?→STATE12 |
| STATE16: | ?−(INTER.CASSEL)?→STATE16) |
| STATE16: | ?PHI(2)?→STATE17 |
| STATE17: | ?PHI(2)?→STATE0 |
| STATE18: | ?PHI(2)?→STATE10 |
| STATE19: | ?PHI(2)?→ |
| | (? WRITEQ?→STATE6 |
| | ?−WRITEQ?→STATE15) |
| STATE20: | ?PHI(2)?→ |
| | (? −ZERO.−BUSY.−ZERONIB?→STATE4 |
| | ?ZERO+BUSY+ZERONIB?→STATE14) |

TABLE C

| | | RTRAM | | | |
|---|---|---|---|---|---|
| | | RLIG | | −RLIG | |
| Conditions | RTRAM | ZERO | −ZERO | ZERO | −ZERO |
| Priorities (BUSAR) | (1) MCLP (REQ2) (2) P(REQ1) | DCLP (REQ3) | (1) MCLP (REQ2) (2) P(REQ1) | DCLP (REQ3) | (1) DCLP (REQ3) (2) P(REQ1) |
| Column No. | 1 | 2 | 3 | 4 | 5 |

I claim:

1. A graphics system comprising in combination:
   (a) A dynamic random access memory (DRAM) for storing display information words;
   (b) a control microcomputer which provides first single address memory access requests;
   (c) a graphic controller which comprises:
      (i) a microcomputer interface for coupling said graphics controller to said control microcomputer;
      (ii) a graphics processor which provides second single address memory access requests;
      (iii) a display processor which provides third single address memory access requests, first multi-address memory access requests and second multi-address memory access requests, and which comprises a synchronization generator for interfacing said graphics controller to a graphics display;
   (d) first arbitrating means for receiving said first, second and third single address memory access requests and for selecting therefrom a preselected request; and
   (e) a DRAM controller comprising second arbitrating means for receiving said preselected request, and said first and second multi-address memory access requests and for selecting therefrom an executable request for processing in said DRAM.

2. A graphics system as claimed in claim 1, wherein said first multi-address memory access requests are requests for reading bursts and said second multi-address memory access requests are refresh requests.

3. A graphics system display according to claim 2, wherein said display information words comprise pixels of a screen line which are read into said DRAM from said DRAM controller, characterized in that the said display processor further comprises means for detecting when all the pixels of a screen line have been read into said DRAM, and then immediately generating a refresh request.

4. A graphics system according to claim 3, wherein said DRAM controller comprises means for managing the execution of both said requests for reading bursts, and said refresh request.

5. A graphics system according to claim 4, wherein said first arbitrating means selects said preselected request in accordance with a selected priority chosen from a plurality of preselection priorities, and wherein said selected priority is determined according to which of a respective one of a plurality of system periods, the system is operating in, said plurality of system periods comprising display, refresh, line return and frame periods.

6. A graphics system according to claim 5, wherein said display processor comprises a first-in-first-out memory to store a plurality of pixels to be displayed, said FIFO emitting a signal when it is full, characterized in that said DRAM controller comprises an automatic system which upon receiving said signal, causes said request for reading bursts to be interrupted.

7. Graphics system according to claim 5, characterized in that the said automatic system is constructed in the form of a programmable logic array (PLA).

8. A graphics system according to claim 6 wherein said DRAM is organized according to a mode chosen from the following modes: a four-bit mode, a page mode, with interlacing of the memory banks of said DRAM and a page mode without interlacing of the memory banks of said DRAM, said choice being made on the initiative of said control microcomputer and stored in a register of said DRAM controller, characterized in that said automatic system is connected to said register and generates sequences of control signals related to said choice of mode.

9. Graphics system according to claim 8, characterized in that the said automatic system is constructed in the form of a programmable logic array. (PLA).

10. A graphics controller for use in a graphics system comprising in combination a DRAM for storing display information words, a control microcomputer which provides first single address memory access requests, a first arbitrating means, and a DRAM controller comprising second arbitrating means, said graphics controller comprising:

(a) a microcomputer interface for coupling said graphics controller to said control microcomputer;
(b) a graphics processor which provides second single address memory access requests;
(c) a display processor which provides third single address memory access requests, first multi-address memory access requests and second multi-address memory access requests, and which comprises a synchronization generator for interfacing said graphics controller to a graphics display;
wherein said first arbitrating means receives said first, second and third single address memory access requests and selects therefrom a preselected request and said second arbitrating means receives said preselected request and said first and second multi-address memory access requests and selects therefrom an executable request for processing in said DRAM.

11. A DRAM controller for use in a graphic system comprising in combination:
(a) a DRAM for storing display information words;
(b) a control microcomputer which provides first single address memory access requests;
(c) a graphics controller which comprises:
  (i) a microcomputer interface for coupling said graphics controller to said control microcomputer;
  (ii) a graphic processor which provides second single address memory access requests;
  (iii) a display processor which provides third single address memory access requests, first multi-address memory access requests and second multi-address memory access request, and which comprises a synchronization generator for interfacing said graphics controller to a graphics display; and
(d) first arbitrating means for receiving said first, second and third single address memory access requests and selecting therefrom a preselected request;
wherein said DRAM controller comprises second arbitrating means for receiving said preselected request and said first and second multi-address memory access requests and selects therefrom an executable request for processing in said DRAM.

* * * * *